United States Patent
Hiraoka et al.

(10) Patent No.: US 8,030,713 B2
(45) Date of Patent: Oct. 4, 2011

(54) SEMICONDUCTOR DEVICE

(75) Inventors: Takayuki Hiraoka, Kanagawa (JP); Toshikazu Fukuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 12/401,698

(22) Filed: Mar. 11, 2009

(65) Prior Publication Data

US 2009/0289310 A1    Nov. 26, 2009

(30) Foreign Application Priority Data

May 26, 2008    (JP) .................................. 2008-137103

(51) Int. Cl.
*H01L 27/088*    (2006.01)

(52) U.S. Cl. ............ 257/392; 257/E27.06; 257/E21.193

(58) Field of Classification Search .................. 257/392, 257/500, E27.06, E29.116, E21.431, 616, 257/E31.049, E21.193
See application file for complete search history.

(56) References Cited

U.S. PATENT DOCUMENTS

| | | | | |
|---|---|---|---|---|
| 5,519,355 A | * | 5/1996 | Nguyen | 327/565 |
| 5,698,869 A | * | 12/1997 | Yoshimi et al. | 257/192 |
| 2007/0221956 A1 | * | 9/2007 | Inaba | 257/197 |

* cited by examiner

*Primary Examiner* — Thomas L Dickey
*Assistant Examiner* — Nikolay Yushin
(74) *Attorney, Agent, or Firm* — Turocy & Watson, LLP

(57) ABSTRACT

A silicon-germanium non-formation region not formed with a silicon germanium layer and a silicon-germanium formation region formed with a silicon germanium layer are provided in a silicon chip, an internal circuit and an input/output buffer are arranged in the silicon-germanium formation region, and a pad electrode and an electrostatic protection element are arranged in the silicon-germanium non-formation region.

13 Claims, 5 Drawing Sheets

SEMICONDUCTOR DEVICE

CROSS-REFERENCE TO RELATED APPLICATIONS

This application is based upon and claims the benefit of priority from the prior Japanese Patent Application No. 2008-137103, filed on May 26, 2008; the entire contents of which are incorporated herein by reference.

BACKGROUND OF THE INVENTION

1. Field of the Invention

The present invention relates to a semiconductor device and a semiconductor device manufacturing method, and, more particularly to a semiconductor device and a semiconductor device manufacturing method suitable for application to a semiconductor device having silicon germanium layers mounted together on a silicon substrate.

2. Description of the Related Art

In some manufacturing processes of semiconductor devices such as a bulk complementary metal-oxide semiconductor (CMOS), driving force of a field-effect transistor is improved by forming an active region in a silicon germanium layer by adding germanium to a silicon substrate (see Study on High Performance (110) PFETs with Embedded SiGe, Okamoto, S.; Miyashita, K.; Yasutake, N.; Okada, T.; Itokawa, H.; Mizushima, I.; Azuma, A; Yoshimura, H.; Nakayama, T.; Electron Devices Meeting, 2007. IEDM 2007. IEEE International, 10-12 Dec. 2007, Page(s): 277-280).

However, when a silicon germanium layer is formed on a silicon substrate, a breakdown voltage of a PN junction decreases, a junction leak current increases, or a forward diffusion current remarkably increases. When a silicon germanium layer is formed in source/drain regions by an epitaxial growth, a PN junction is formed at a position very shallow from an original silicon surface before performing the epitaxial growth. Therefore, a junction leak increases. Consequently, although the method of forming a silicon germanium layer on a silicon substrate is useful to increase speed of a field-effect transistor, this method has a problem of decreasing capacity of an electrostatic protection element, and increasing a leak current during a normal operation, for the electrostatic protection element that includes a PN junction diode and the like.

Furthermore, the method of using a silicon germanium layer particularly contributes to increase driving force of a P-channel field-effect transistor. Therefore, when a load transistor of a static random access memory (SRAM) includes a P-channel field-effect transistor, there are the following problems. An operation of pulling down a bit line at a data writing time is interrupted by the load transistor. As a result, a write margin of the SRAM decreases, and a junction leak of a bit cell unit of the SRAM also increases.

BRIEF SUMMARY OF THE INVENTION

A semiconductor device according to an embodiment of the present invention comprises: a silicon substrate; a first silicon germanium layer formed on the silicon substrate; a second silicon germanium layer formed on the silicon substrate, and having higher concentration of germanium than that in the first silicon germanium layer; a first semiconductor element formed by using the first silicon germanium layer; and a second semiconductor element formed by using the second silicon germanium layer, wherein the second semiconductor element has larger driving force than that of the first semiconductor element.

A semiconductor device according to an embodiment of the present invention comprises: a silicon substrate; a silicon germanium layer formed in a part of a region on the silicon substrate; a first semiconductor element formed on the silicon substrate without using the silicon germanium layer; and a second semiconductor element formed on the silicon substrate by using the silicon germanium layer, wherein the second semiconductor element has larger driving force than that of the first semiconductor element.

A semiconductor device manufacturing method according to an embodiment of the present invention comprises: selectively forming on a silicon substrate a blocking layer that blocks an epitaxial growth of a silicon germanium layer on the silicon substrate; selectively epitaxially growing the silicon germanium layer on the silicon substrate using the blocking layer as a mask; removing the blocking layer from the silicon substrate after the selectively epitaxially growing the silicon germanium layer on the silicon substrate; forming a first semiconductor element on the silicon substrate by using the silicon germanium layer that is selectively epitaxially grown; and forming a second semiconductor element on the silicon substrate without using the silicon germanium layer that is selectively epitaxially grown.

DETAILED DESCRIPTION OF THE INVENTION

Exemplary embodiments of a semiconductor device according to the present invention will be explained below in detail with reference to the accompanying drawings.

Figure 1:
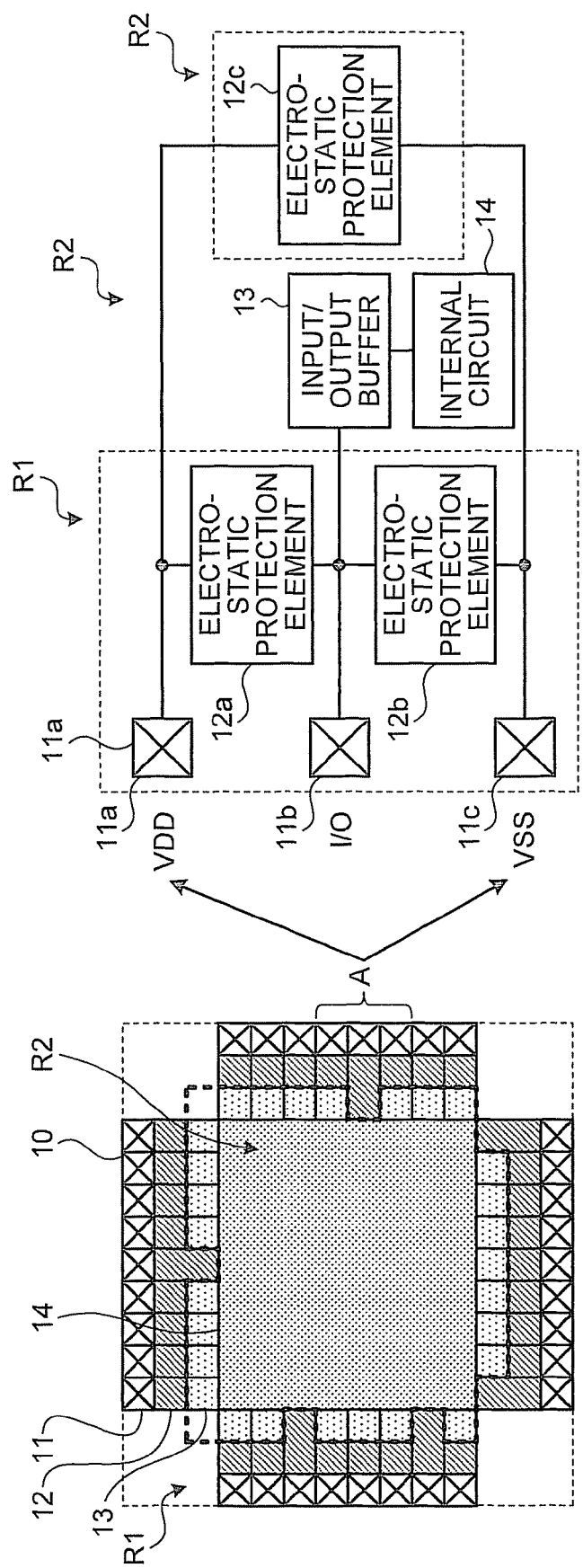
FIG. 1 is a plan view of a schematic configuration of a semiconductor device according to a first embodiment of the present invention, and is a block diagram of a functional configuration of a part A.

FIG. 1 is a plan view of a schematic configuration of a semiconductor device according to a first embodiment of the present invention, and is a block diagram of a functional configuration of a part A.

In FIG. 1, an internal circuit 14 has a silicon chip 10 formed therein, and a pad electrode 11, an electrostatic protection element 12, and an input/output (I/O) buffer 13 are formed at the periphery of the internal circuit 14. The internal circuit 14 can be configured by a circuit of which particularly driving force is preferably increased, such as a logic circuit, a processor, various arithmetic circuits, and a dynamic random access memory (DRAM). The electrostatic protection element 12 can be configured by a diode string, a thyristor, a bipolar transistor, or a field-effect transistor not particularly requiring driving force.

The silicon chip 10 includes a silicon-germanium non-formation region R1 in which a silicon germanium layer is not formed, and a silicon-germanium formation region R2 in which a silicon germanium layer is formed. The silicon-germanium non-formation region R1 can be arranged at an periphery of the silicon chip 10, and the silicon-germanium formation region R2 can be arranged at the inside of the silicon-germanium non-formation region R1. The internal circuit 14 and the I/O buffer 13 are arranged in the silicon-germanium formation region R2, and the pad electrode 11 and the electrostatic protection element 12 are arranged in the silicon-germanium non-formation region R1.

For example, pad electrodes 11a to 11c are provided as the pad electrode 11, and electrostatic protection elements 12a to 12c are provided as the electrostatic protection element 12, for example. The electrostatic protection element 12a can be connected between the pad electrodes 11a and 11b. The electrostatic protection element 12b can be connected between the pad electrodes 11b and 11c. The electrostatic protection element 12c can be connected between the pad electrodes 11a and 11c. The I/O buffer 13 can be connected to the pad electrode 11b. The pad electrode 11a can be connected to a high power-source potential VDD. The pad electrode 11b can be connected to an input/output terminal I/O. The pad electrode 11c can be connected to a low power-source potential VSS.

When a surge voltage is applied to the pad electrodes 11a and 11b, the electrostatic protection element 12a can short-circuit between the pad electrodes 11a and 11b, thereby protecting the I/O buffer 13 and the internal circuit 14 from static electricity. When a surge voltage is applied to the pad electrodes 11b and 11c, the electrostatic protection element 12b can short-circuit between the pad electrodes 11b and 11c, thereby protecting the I/O buffer 13 and the internal circuit 14 from static electricity. When a surge voltage is applied to the pad electrodes 11a and 11c, the electrostatic protection element 12c can clamp a voltage applied between the pad electrodes 11a and 11c.

The internal circuit 14 and the I/O buffer 13 can be arranged in the silicon-germanium formation region R2, and the pad electrodes 11a to 11c and the electrostatic protection elements 12a to 12c can be arranged in the silicon-germanium non-formation region R1.

With the above arrangement, the internal circuit 14 and the I/O buffer 13 can be formed on the silicon chip 10 by using a silicon germanium layer, and the electrostatic protection element 12 can be formed on the silicon chip 10 without using a silicon germanium layer. Therefore, the internal circuit 14 and the I/O buffer 13 can achieve improvement of driving force by using the silicon germanium layer. The electrostatic protection element 12 can prevent a decrease of a breakdown voltage due to the silicon germanium layer, and can prevent an increase of a forward current in a diffusion current region. Even when the electrostatic protection element 12 and the internal circuit 14 are mounted together on the same silicon chip 10, a reduction of the capacity of the electrostatic protection element 12 and an increase of a leak current during a normal operation can be prevented.

Figure 2:
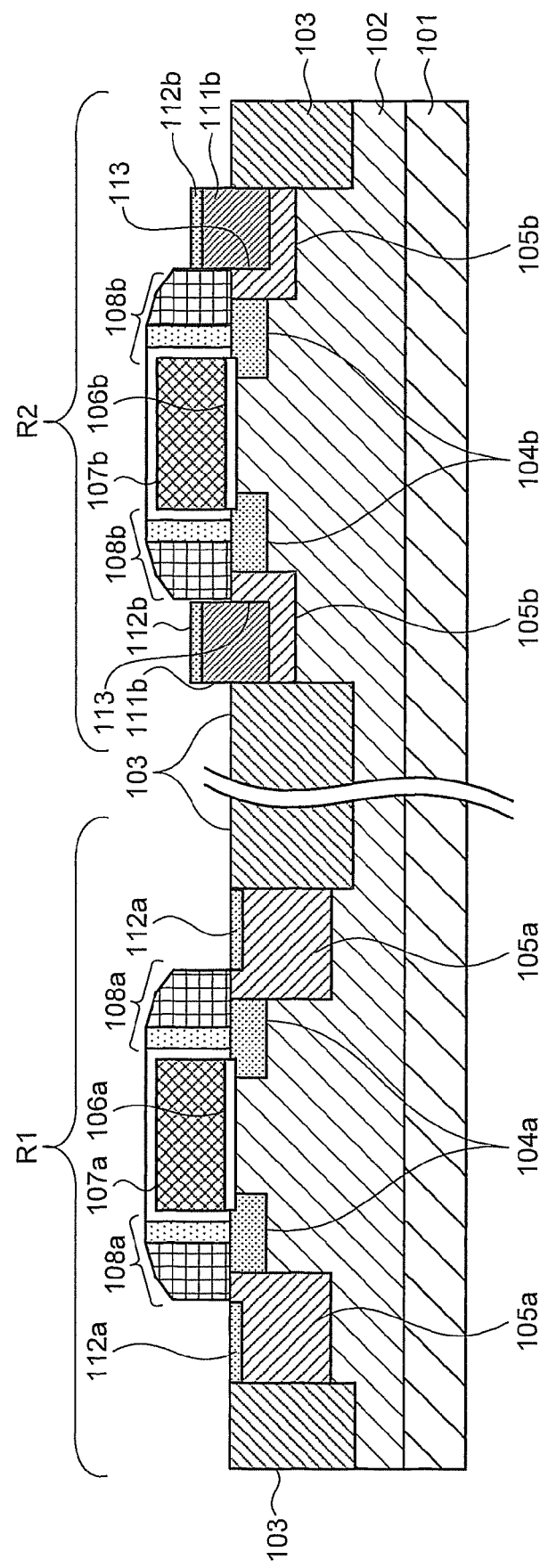
FIG. 2 is a cross-sectional view of a schematic configuration of a part of the semiconductor device according to the first embodiment.

FIG. 2 is a cross-sectional view of a schematic configuration of a part of the semiconductor device according to the first embodiment.

In FIG. 2, a silicon substrate 101 is provided in the silicon chip 10 shown in FIG. 1. A well 102 is formed on the silicon substrate 101. An element isolation region 103 in which element isolation is performed is formed on the well 102. A P-type silicon substrate, for example, can be used for the silicon substrate 101, and an N-well, for example, can be used for the well 102. For the element isolation region 103, there can be used a shallow trench isolation (STI) configuration, or a local oxidation of silicon (LOCOS) configuration.

In the silicon-germanium non-formation region R1, a gate electrode 107a is formed on the well 102 via a gate insulating film 106a, and sidewalls 108a are formed on lateral side of the gate electrode 107a. Lightly doped drain (LDD) layers 104a are formed beneath the sidewalls 108a at both sides of the gate electrode 107a. High-concentration-impurity diffusion layers 105a are formed at the outside of the LDD layers 104a. Silicide layers 112a are formed on the high-concentration-impurity diffusion layers 105a.

On the other hand, in the silicon-germanium formation region R2, a gate electrode 107b is formed on the well 102 via a gate insulating film 106b, and sidewalls 108b are formed on lateral side of the gate electrode 107b. LDD layers 104b are formed beneath the sidewalls 108b at both sides of the gate electrode 107b. High-concentration-impurity diffusion layers 105b are formed at the outside of the LDD layers 104b. Silicon germanium layers 111b are formed on the high-concentration-impurity diffusion layers 105b. Silicide layers 112b are formed on the silicon germanium layers 111b.

The LDD layers 104a and 104b, the high-concentration-impurity diffusion layers 105a and 105b, and the silicon germanium layers 111b can have P-type conductivity. The high-concentration-impurity diffusion layers 105a and 105b can constitute source/drain layers of a P-channel field-effect transistor. Boron can be used as an impurity introduced into the LDD layers 104a and 104b, the high-concentration-impurity diffusion layers 105a and 105b, and the silicon germanium layers 111b. A thermally-oxidized film, for example, can be used for gate insulating films 116a and 116b. Polycrystalline silicon, for example, can be used for the gate electrodes 107a and 107b. For the sidewalls 108a and 108b, there can be used a three-layer configuration made of a chemical-vapor-deposited (CVD) oxide film using a thermally-oxidized film, a silicon nitride film, and tetraethoxysilane (TEOS), for example. Alternatively, a phospho-silicate-glass (PSG) film or a borophospho-silicate-glass (BPSG) film can be used instead of the CVD oxide film using TEOS.

In selectively forming the silicon germanium layers 11b in the silicon-germanium formation region R2, the element isolation region 103 is formed on the silicon substrate 101. After the gate electrodes 107a and 107b are formed on the silicon substrate 101 via the gate insulating films 106a and 106b, respectively, the sidewalls 108a and 108b are formed on the side walls of the gate electrodes 107a and 107b, respectively.

A blocking layer arranged to cover the silicon-germanium non-formation region R1 is selectively formed on the silicon substrate 101 on which the sidewalls 108a and 108b are formed, by selective etching using a photographic technique. The blocking layer can block an epitaxial growth of the silicon germanium layers 11b on the silicon substrate 101. For a material of the blocking layer, there can be used a silicon oxide film, a silicon nitride film, or a PSG film, for example. A material of the blocking layer is selected to have a larger selection ratio at an etching time than that of the sidewalls 108a and 108b.

The silicon substrate 101 is etched using the blocking layer as a mask, thereby forming on the silicon substrate 101 recesses 113 arranged to sandwich a channel region beneath the gate electrode 107b in the silicon-germanium formation region R2. The recesses 113 can be formed in self alignment in the silicon-germanium formation region R2, using the gate electrode 107b and the sidewalls 108b as masks.

The silicon germanium layers 111b are selectively epitaxially grown on the silicon substrate 101 so that the recesses 113 are embedded using the blocking layer as a mask. With this arrangement, the silicon germanium layers 111b are selectively formed in the silicon-germanium formation region R2. In epitaxially growing the silicon germanium layers 111b on the surface of the silicon substrate 101, there can be used a SiH$_4$ (silane) gas, a Si$_2$H$_6$ (disilane) gas, or a SiH$_2$HCl$_2$ (dichlorosilane) gas, for example, as a silicon source gas. A GeH$_4$ (monogerman) gas can be used, for example, as a germanium source gas.

When the silicon germanium layers 111b are formed in the silicon-germanium formation region R2, the blocking layer is removed from the silicon substrate 101.

An activation rate of boron increases more than that of silicon, in the silicon germanium layers 111b. Therefore, contact resistance can be decreased by forming the silicon germanium layers 111b on the silicon substrate 101. By forming the silicon germanium layers 111b on the silicon substrate 101, stress can be generated in the silicon substrate 101, thereby increasing mobility of carriers. Therefore, particularly, driving force can be considerably improved in the P-channel field-effect transistor. Accordingly, a P-channel field-effect transistor particularly requiring the driving force is arranged in the silicon-germanium formation region R2, and a P-channel field-effect transistor not particularly requiring the driving force is arranged in the silicon-germanium non-formation region R1. With this arrangement, characteristics of the silicon germanium layers 111b can be improved, without conspicuously degrading characteristics of the silicon germanium layers 111b.

The silicon germanium layers 111b have a higher lattice constant than that of the silicon substrate 101. Therefore, compressive stress can be applied to the channel region beneath the gate electrode 107b, by embedding the silicon germanium layers 111b into the high-concentration-impurity diffusion layer 105b. Consequently, mobility of holes in the channel region beneath the gate electrode 107b can be increased, and the speed of the P-channel field-effect transistor can be increased.

Figure 3:
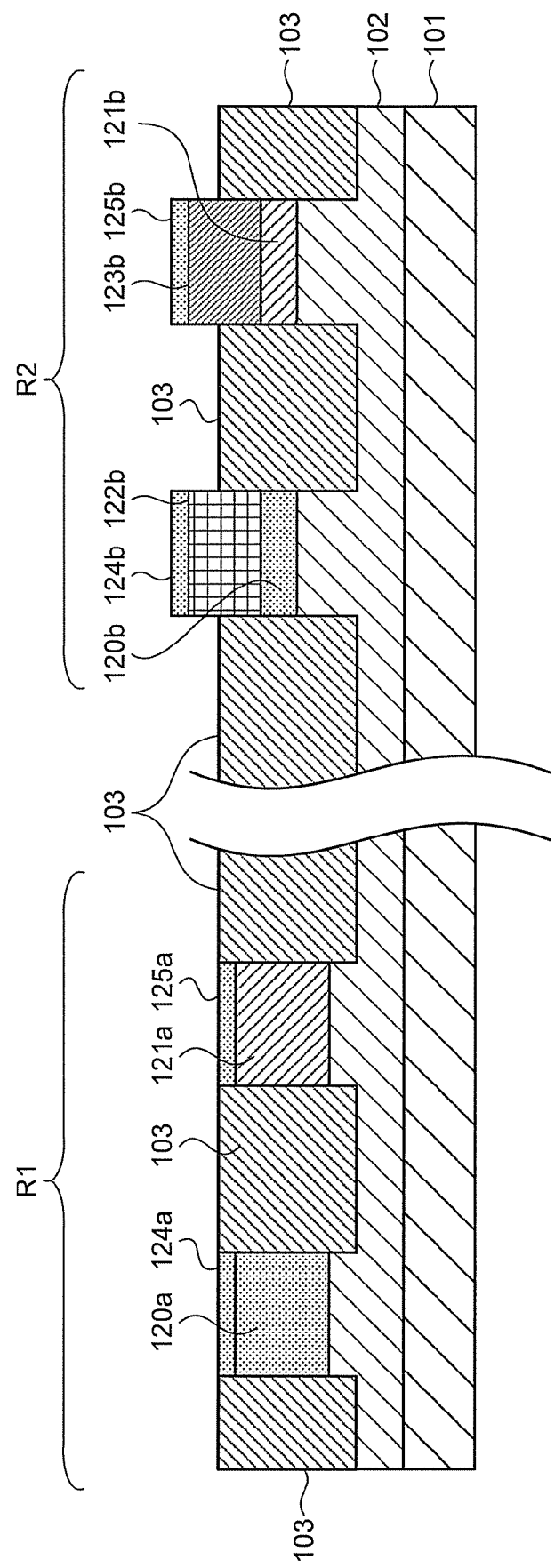
FIG. 3 is a cross-sectional view of a schematic configuration of other part of the semiconductor device according to the first embodiment.

FIG. 3 is a cross-sectional view of a schematic configuration of other part of the semiconductor device according to the first embodiment.

In FIG. 3, the silicon substrate 101 is provided in the silicon chip 10 shown in FIG. 1. The well 102 is formed on the silicon substrate 101. The element isolation region 103 in which element isolation is performed is formed on the well 102.

In the silicon-germanium non-formation region R1, there are formed an N-type-high-concentration impurity-diffusion layer 120a and a P-type-high-concentration impurity-diffusion layer 121a that are isolated from each other by the element isolation region 103. Silicide layers 124a and 125a are formed on the N-type-high-concentration impurity-diffusion layer 120a and the P-type-high-concentration impurity-diffusion layer 121a, respectively.

On the other hand, in the silicon-germanium formation region R2, there are formed an N-type-high-concentration impurity-diffusion layer 120b and a P-type-high-concentration impurity-diffusion layer 121b that are isolated from each other by the element isolation region 103. An N-type silicon-germanium layer 122b and a P-type silicon-germanium layer 123b are formed on the N-type-high-concentration impurity-diffusion layer 120b and the P-type-high-concentration impurity-diffusion layer 121b, respectively. Silicide layers 124b and 125a are formed on the N-type silicon-germanium layer 122b and the P-type silicon-germanium layer 123b, respectively.

In selectively forming the N-type silicon-germanium layer 122b and the P-type silicon-germanium layer 123b in the silicon-germanium formation region R2, selective etching using a photolithographic technique is used. With this arrangement, a blocking layer arranged to cover the silicon-germanium non-formation region R1 is selectively formed on the silicon substrate 101.

The N-type silicon-germanium layer 122b and the P-type silicon-germanium layer 123b are selectively epitaxially grown on the surface of the silicon substrate 101, using the blocking layer as a mask. After the N-type silicon-germanium layer 122b and the P-type silicon-germanium layer 123b are formed in the silicon-germanium formation region R2, the blocking layer is removed from the silicon substrate 101.

In the P-type silicon-germanium layer 123b, an activation rate of boron increases more than that of silicon. Therefore, contact resistance can be decreased by forming the P-type silicon-germanium layer 123b on the silicon substrate 101. Therefore, a device particularly requiring driving force can be formed in the silicon-germanium formation region R2. A device not particularly requiring driving force and generating a trouble in the operation due to a decrease of a breakdown voltage and due to an increase of a forward current in the diffusion current region can be formed in the silicon-germanium non-formation region R1.

Figure 4:
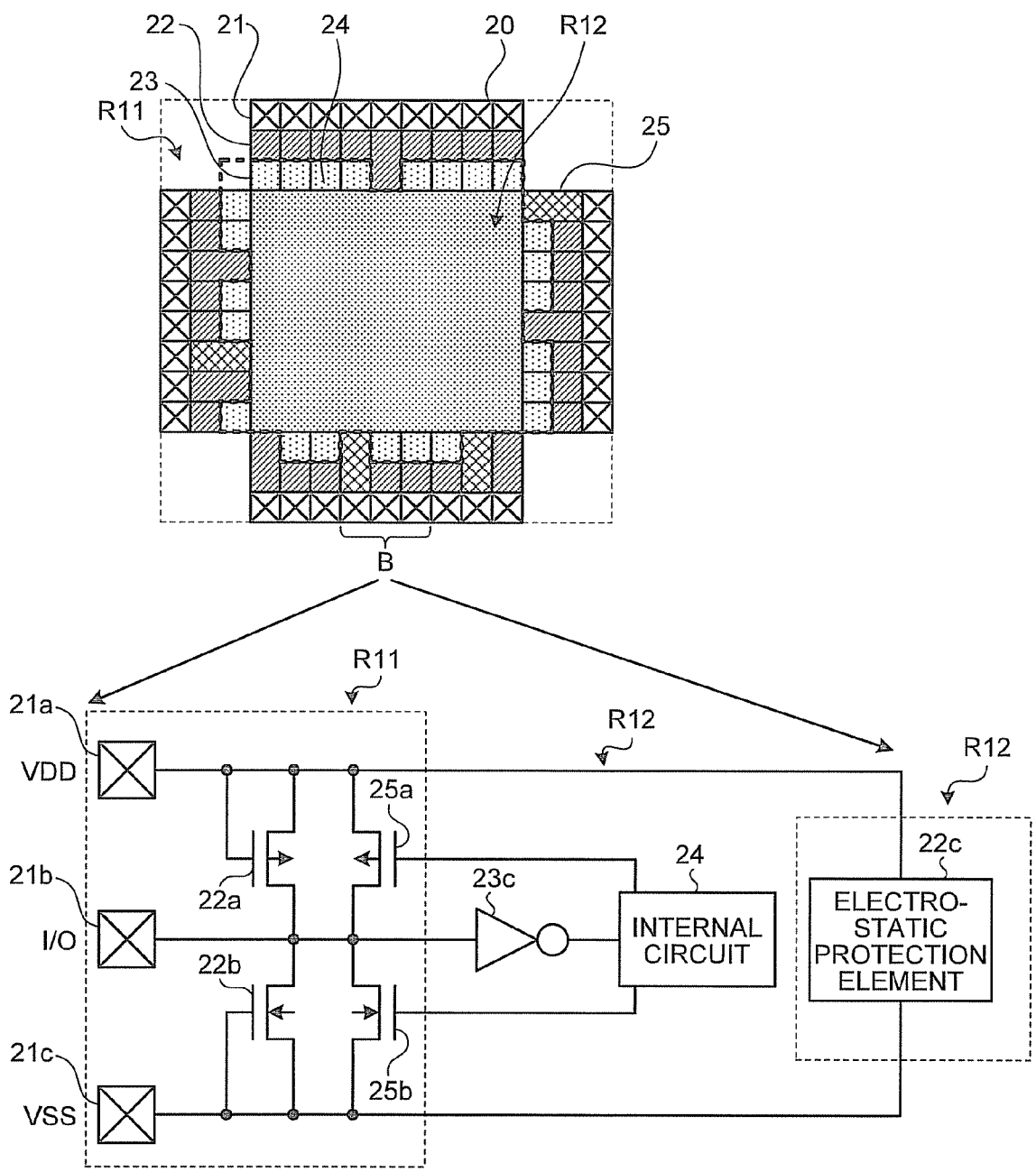
FIG. 4 is a plan view of a schematic configuration of a semiconductor device according to a second embodiment of the present invention, and is a block diagram of a functional configuration of a part B.

FIG. 4 is a plan view of a schematic configuration of a semiconductor device according to a second embodiment of the present invention, and is a block diagram of a functional configuration of a part B.

In FIG. 4; an internal circuit 24 is formed in a silicon chip 20. A pad electrode 21, an electrostatic protection element 22, an input buffer 23, and an output buffer 25 are formed at the periphery of the internal circuit 24. The internal circuit 24 can be configured by a circuit of which particularly driving force is preferably increased, such as a logic circuit, a processor, various arithmetic circuits, and a DRAM. The electrostatic protection element 22 can be configured by a diode string, a thyristor, a bipolar transistor, or a field-effect transistor not particularly requiring driving force.

The silicon chip 20 includes a silicon-germanium non-formation region R11 in which a silicon germanium layer is not formed, and a silicon-germanium formation region R12 in which a silicon germanium layer is formed. The internal circuit 24 and the input buffer 23 are arranged in the silicon-germanium formation region R12, and the pad electrode 21, the electrostatic protection element 22, and the output buffer 25 are arranged in the silicon-germanium non-formation region R11.

For example, pad electrodes 21a to 21c are provided for the pad electrode 21, and field-effect transistors 22a and 22b and an electrostatic protection element 22c are provided for the electrostatic protection element 22. An inverter 23c is provided for the input buffer 23, and field-effect transistors 25a and 25b are provided for the output buffer 25. The field-effect transistors 22a and 25a are connected between the pad electrodes 21a and 21b. A gate of the field-effect transistor 22a is connected to the pad electrode 21a, and a gate of the field-effect transistor 25a is connected to the internal circuit 24. The field-effect transistors 22b and 25b are connected between the pad electrodes 21b and 21c. A gate of the field-effect transistor 22b is connected to the pad electrode 21c, and a gate of the field-effect transistor 25b is connected to the internal circuit 24. The electrostatic protection element 22c is connected between the pad electrodes 21a and 21c. The pad electrode 21b is connected to the internal circuit 24 via the inverter 23c. The pad electrode 21a can be connected to a high power-source potential VDD. The pad electrode 21b can be connected to an input/output terminal I/O. The pad electrode 21c can be connected to a low power-source potential VSS.

A high power-source potential VDD is applied to a gate of the field-effect transistor 22a, and usually, the field-effect transistor 22a is maintained in an off state. A low power-source potential VSS is applied to a gate of the field-effect transistor 22b, and usually, the field-effect transistor 22b is maintained in an off state.

When a surge voltage is applied to the pad electrodes 21a and 21b, the field-effect transistor 22a can short-circuit between the pad electrodes 21a and 21b, thereby protecting the internal circuit 24 from static electricity. When a surge voltage is applied to the pad electrodes 21b and 21c, the field-effect transistor 22b can short-circuit between the pad electrodes 21b and 21c, thereby protecting the internal circuit 24 from static electricity. When a surge voltage is applied to the pad electrodes 21a and 21c, the electrostatic protection element 22c can clamp a voltage applied between the pad electrodes 21a and 21c.

When a voltage from the internal circuit 24 is applied to gates of the field-effect transistors 25a and 25b, respectively, the field-effect transistors 25a and 25b can output signals corresponding to this voltage from the pad electrode 21b, respectively.

The internal circuit 24 and the inverter 23c can be arranged in the silicon-germanium formation region R12. The pad electrodes 21a to 21c, the electrostatic protection element 22c, and the field-effect transistors 22a, 22b, 25a, and 25b can be arranged in the silicon-germanium non-formation region R11.

With the above arrangement, the inverter 23c can be arranged in the silicon-germanium formation region R12, and the field-effect transistors 22a, 22b, 25a, and 25b can be arranged in the silicon-germanium non-formation region R11. Therefore, driving force of the input buffer 23 can be improved, and the electrostatic protection element 22 and the output buffer 25 can be arranged in parallel close to each other. Consequently, the electrostatic protection element 22 and the output buffer 25 can prevent a nonuniform operation due to a difference between breakdown voltages at an electrostatic discharging time.

Figure 5:
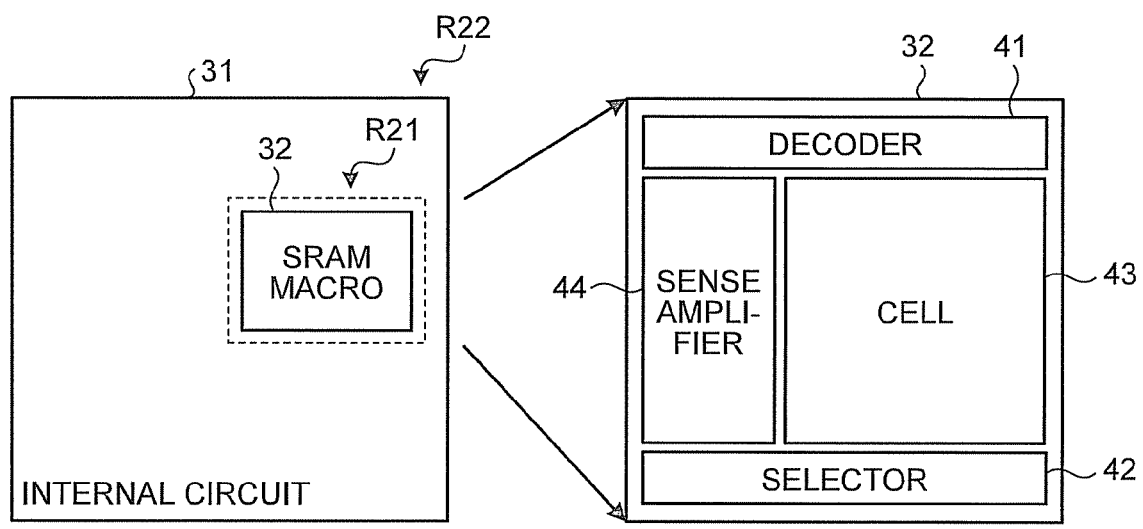
FIG. 5 is a plan view of a schematic configuration of a semiconductor device according to a third embodiment of the present invention.

FIG. 5 is a plan view of a schematic configuration of a semiconductor device according to a third embodiment of the present invention.

In FIG. 5, an internal circuit 31 is formed in a silicon chip, and a SRAM macro 32 is mounted on the internal circuit 31. The internal circuit 31 can be configured by a circuit of which particularly driving force is preferably increased, such as a logic circuit, a processor, various arithmetic circuits, and a DRAM. The SRAM macro 32 can include a decoder 41, a selector 42, a cell 43, and a sense amplifier 44. The cell 43 can include two load resistors, two driving transistors, and two transfer transistors, for each bit cell. A P-channel field-effect transistor can be used for the load transistor. An N-channel field-effect transistor can be used for the driving transistor and the transfer transistor. A bit line is connected to a source of the transfer transistor, and a word line is connected to a gate of the transfer transistor.

The silicon chip includes a silicon-germanium non-formation region R21 in which a silicon germanium layer is not formed, and a silicon-germanium formation region R22 in which a silicon germanium layer is formed. The internal circuit 31 is arranged in the silicon-germanium formation region R22, and the SRAM macro 32 is arranged in the silicon-germanium non-formation region R21.

A write driver including an N-channel field-effect transistor can pull down a bit line and a SRAM internal node, and invert latch data of the bit cell, and thus data writing into the SRAM can be performed.

An increase of driving force of the load transistor made of a P-channel field-effect transistor can be suppressed by arranging the SRAM macro 32 in the silicon-germanium non-formation region R21. Therefore, an interruption by the load transistor of the operation of pulling down the bit line at the data writing time can be suppressed. As compared with when the SRAM-macro 32 is arranged in the silicon-germanium formation region R22, a write margin of the SRAM at a low-voltage operation time can be improved, and a junction leak of the cell 43 of the SRAM can be decreased.

In the above embodiments, the following method has been explained: a device of which operation has a trouble due to a decrease of a breakdown voltage of a PN junction, an increase of a junction leak current, and an increase of a forward diffusion current is arranged in the silicon-germanium non-formation region; and a device of which particularly driving force is preferably increased is arranged in the silicon-germanium formation region. Alternatively, silicon-germanium formation regions having mutually different germanium concentrations can be formed on the same silicon chip. A device having a trouble in the operation due to a decrease of a breakdown voltage, and an increase of a forward current in the diffusion current region can be arranged in a silicon-germanium formation region having low concentration of germanium. A device of which particularly driving force is preferably increased can be arranged in a silicon-germanium formation region having high concentration of germanium. In this case, a silicon germanium layer having high concentration is preferably embedded into a silicon substrate.

Further, when a silicon germanium layer is provided beneath a gate as well as when a silicon germanium layer is used for a source and a drain of a field-effect transistor, an electrostatic protection element and a SRAM can be selectively formed in the silicon-germanium non-formation region, by a similar method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
 a silicon substrate;
 a first silicon germanium layer formed on the silicon substrate;
 a second silicon germanium layer formed on the silicon substrate, and having higher concentration of germanium than that in the first silicon germanium layer;
 a first semiconductor element formed by using the first silicon germanium layer; and
 a second semiconductor element formed by using the second silicon germanium layer,
 wherein the second semiconductor element has larger driving force than that of the first semiconductor element, and
 wherein the first semiconductor element is an electrostatic protection element or a static random access memory (SRAM) macro circuit, and the second semiconductor element is a logic circuit, a processor, an arithmetic circuit, or a dynamic random access memory (DRAM).

2. A semiconductor device comprising:
 a silicon substrate;
 a first silicon germanium layer formed on the silicon substrate;

a second silicon germanium layer formed on the silicon substrate, and having higher concentration of germanium than that in the first silicon germanium layer;

a first semiconductor element formed by using the first silicon germanium layer; and a second semiconductor element formed by using the second silicon germanium layer, wherein the second semiconductor element has a larger driving force than a driving force of the first semiconductor element, and wherein the first semiconductor element includes an electrostatic protection element and an output buffer arranged in parallel close to the electrostatic protection element and the first semiconductor element includes an input buffer.

3. A semiconductor device, comprising:

a silicon substrate;

a first silicon germanium layer formed on the silicon substrate;

a second silicon germanium layer embedded in the silicon substrate, and having higher concentration of germanium than that in the first silicon germanium layer;

a first semiconductor element formed by using the first silicon germanium layer; and a second semiconductor element formed by using the second silicon germanium layer, wherein the second semiconductor element has a larger driving force than a driving force of the first semiconductor element.

4. A semiconductor device comprising:

a silicon substrate;

a silicon germanium layer formed in a part of a region on the silicon substrate;

a first semiconductor element formed on the silicon substrate without using the silicon germanium layer; and a second semiconductor element formed on the silicon substrate by using the silicon germanium layer, wherein the second semiconductor element has larger driving force than that of the first semiconductor element, and wherein the first semiconductor element is an electrostatic protection element or a static random access memory (SRAM) macro circuit, and the second semiconductor element is a logic circuit, a processor, an arithmetic circuit, or a dynamic random access memory (DRAM).

5. The semiconductor device according to claim 4, wherein the first semiconductor element has a larger breakdown voltage of a PN junction than that of the second semiconductor element.

6. The semiconductor device according to claim 4, wherein the first semiconductor element has a smaller junction leak current than that of the second semiconductor element.

7. The semiconductor device according to claim 4, wherein the first semiconductor element has a smaller forward diffusion current than that of the second semiconductor element.

8. The semiconductor device according to claim 4, further comprising a silicide layer formed on the silicon germanium layer.

9. A semiconductor device comprising:

a silicon substrate;

a silicon germanium layer formed in a part of a region on the silicon substrate;

a first semiconductor element formed on the silicon substrate without using the silicon germanium layer; and a second semiconductor element formed on the silicon substrate by using the second silicon germanium layer, wherein the first semiconductor element includes an electrostatic protection element and an output buffer arranged in parallel close to the electrostatic protection element, and wherein the first semiconductor element includes an input buffer.

10. A semiconductor device comprising:

a silicon substrate;

a silicon germanium layer formed in a part of a region on the silicon substrate;

a first semiconductor element formed on the silicon substrate without using the silicon germanium layer; and a second semiconductor element formed on the silicon substrate by using the second silicon germanium layer, wherein the second semiconductor element has a larger driving force than that of the first semiconductor element, and wherein the second semiconductor element is a P-channel field-effect transistor and the silicon germanium layer is embedded in a source/drain layer of the P-channel field-effect transistor.

11. The semiconductor device according to claim 10, wherein the silicon germanium layer is arranged in self alignment between a sidewall formed on a lateral side of a gate electrode of the P-channel field-effect transistor and an element isolation region formed on the silicon substrate.

12. A semiconductor device comprising:

a silicon substrate;

a silicon germanium layer formed in a part of a region on the silicon substrate;

a first semiconductor element formed on the silicon substrate without using the silicon germanium layer; and a second semiconductor element formed on the silicon substrate by using the second silicon germanium layer, wherein the second semiconductor element is a P-channel field-effect transistor, and wherein the silicon germanium layer is formed to avoid an periphery of a silicon chip, and the periphery has an electrostatic protection element and a pad electrode arranged thereon.

13. The semiconductor device according to claim 12, wherein the periphery further comprises an output buffer.

* * * * *